US009576510B2

(12) United States Patent
Ren et al.

(10) Patent No.: US 9,576,510 B2
(45) Date of Patent: Feb. 21, 2017

(54) DISPLAY DEVICE

(71) Applicant: BOE TECHNOLOGY GROUP CO., LTD., Beijing (CN)

(72) Inventors: Yan Ren, Beijing (CN); Zifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 14/646,188

(22) PCT Filed: Oct. 31, 2014

(86) PCT No.: PCT/CN2014/090043
§ 371 (c)(1),
(2) Date: May 20, 2015

(87) PCT Pub. No.: WO2015/180411
PCT Pub. Date: Dec. 3, 2015

(65) Prior Publication Data
US 2016/0300513 A1 Oct. 13, 2016

(30) Foreign Application Priority Data
May 30, 2014 (CN) .......................... 2014 1 0239059

(51) Int. Cl.
H05K 5/00 (2006.01)
G09F 9/30 (2006.01)
(Continued)

(52) U.S. Cl.
CPC .............. *G09F 9/301* (2013.01); *G06F 1/1652* (2013.01); *H01L 51/5237* (2013.01);
(Continued)

(58) Field of Classification Search
CPC .............. H05K 1/00; H05K 1/02; H05K 1/18; H05K 1/028; H05K 3/361; G06F 1/16
(Continued)

(56) References Cited

U.S. PATENT DOCUMENTS 7,791,279 B2 * 9/2010 Kwon ....................... H01J 5/48
313/582
9,123,290 B1 * 9/2015 Cho ....................... G06F 1/1652
(Continued)

FOREIGN PATENT DOCUMENTS

| CN | 1347233 A | 5/2002 |
|----|-----------|--------|
| CN | 101201486 A | 6/2008 |

(Continued)

OTHER PUBLICATIONS

1st office action issued in Chinese application No. 201410239059.6 dated Oct. 30, 2015.
(Continued)

Primary Examiner — Hung S Bui
(74) Attorney, Agent, or Firm — Nath Goldberg & Meyer; Joshua B. Goldberg; Leonid D. Thenor

(57) ABSTRACT

The present invention relates to the field of display technology, and particularly relates to a bendable flexible display device. The display device comprises a display screen, a back plate arranged on the back of the display screen, and a support, the back plate being arranged on the support, wherein the back plate is a spliced back plate, and the display screen is a flexible display screen; and the back plate allows the display screen to be converted between a curved display state and a flat display state. The display device can be converted between a curved display state and a flat display state, to implement various viewing modes and meet different demands of all kinds of people.

18 Claims, 10 Drawing Sheets

(51) Int. Cl.
  *H01L 51/52* (2006.01)
  *H05K 5/02* (2006.01)
  *H05K 5/03* (2006.01)
  *H05K 7/02* (2006.01)
  *G06F 1/16* (2006.01)
(52) U.S. Cl.
  CPC ......... *H05K 5/0004* (2013.01); *H05K 5/0017* (2013.01); *H05K 5/0217* (2013.01); *H05K 5/03* (2013.01); *H05K 7/02* (2013.01); *H01L 2251/5338* (2013.01)
(58) Field of Classification Search
  USPC .............. 361/728, 730, 749, 679.04, 679.27
  See application file for complete search history.

(56) References Cited

U.S. PATENT DOCUMENTS

| | | | | |
|---|---|---|---|---|
| 9,179,559 | B1* | 11/2015 | Kim | G06F 1/1616 |
| 9,282,667 | B2* | 3/2016 | Song | H05K 7/02 |
| 9,304,539 | B2* | 4/2016 | Song | G06F 1/1601 |
| 9,395,758 | B2* | 7/2016 | Zhang | G06F 1/1601 |
| 2008/0258030 | A1* | 10/2008 | Hsuan | F16M 11/04 248/346.03 |
| 2010/0201604 | A1 | 8/2010 | Kee et al. | |
| 2011/0228190 | A1 | 9/2011 | Yang et al. | |
| 2012/0147599 | A1 | 6/2012 | Shim et al. | |
| 2013/0155655 | A1* | 6/2013 | Lee | H05K 5/03 362/97.1 |
| 2014/0003006 | A1* | 1/2014 | Ahn | G06F 1/1679 361/749 |
| 2014/0226266 | A1* | 8/2014 | Kang | H01L 51/0097 361/679.01 |

FOREIGN PATENT DOCUMENTS

| | | |
|---|---|---|
| CN | 201749635 U | 2/2011 |
| CN | 203118369 U | 8/2013 |
| CN | 103559835 A | 2/2014 |
| CN | 103827771 A | 5/2014 |
| CN | 104050882 A | 9/2014 |
| TW | 200945940 A | 11/2009 |

OTHER PUBLICATIONS

International Search Report dated Oct. 31, 2014 corresponding to International application No. PCT/CN2014/090043.
Written Opinion of the International Searching Authority dated Mar. 6, 2015 corresponding to International application No. PCT/CN2014/090043.
2nd office action issued in corresponding Chinese application No. 201410239059.6 dated Mar. 28, 2016.

* cited by examiner

“DISPLAY DEVICE

This is a National Phase Application filed under 35 U.S.C. 371 as a national stage of PCT/CN2014/090043 filed on Oct. 31, 2014, an application claiming the benefit to Chinese application No. 201410239059.6 filed on May 30, 2014; the content of each of which is hereby incorporated by reference in its entirety.

FIELD OF THE INVENTION

The present invention relates to the field of display technology, and particularly relates to a bendable flexible display device.

BACKGROUND OF THE INVENTION

Currently mainstream display devices are flat-panel display devices, and curved display devices have emerged with the progress of science and technology. Curved display devices can make viewers feel effect like in a cinema, and thus lead a popular trend. However, a curved display device has a small viewing angle, and is only suitable for viewing by a few persons sitting in the middle in front of the display device, but not suitable for viewing by many people.

It is difficult to implement both curved display and flat display in current display devices.

SUMMARY OF THE INVENTION

A technical problem to be solved by the present invention is providing a display device that can be converted between a curved display state and a flat display state, to implement various viewing modes and meet different demands of all kinds of people, in view of the above-mentioned shortcomings in the prior art.

A technical solution adopted to solve the technical problem of the present invention is the display device, including a display screen, a back plate arranged on a back of the display screen, and a support, the back plate being arranged on the support, wherein the back plate is a spliced back plate, and the display screen is a flexible display screen; and the back plate allows the display screen to be converted between a curved display state and a flat display state.

In one embodiment, the back plate includes a central-axis sub-plate, intermediate sub-plates and border sub-plates; the central-axis sub-plate is arranged in a vertical central region of the display screen and connected with the support; the plurality of intermediate sub-plates are symmetrically distributed along a horizontal direction of the central-axis sub-plate about a vertical axis of the central-axis sub-plate as a symmetry axis; the border sub-plates are arranged on outer sides of the intermediate sub-plates away from the central-axis sub-plate; and the central-axis sub-plate, the plurality of intermediate sub-plates and the border sub-plates are movably connected.

In one embodiment, horizontal position-limiting units are arranged on borders of adjacent sub-plates, among the central-axis sub-plate, the plurality of intermediate sub-plates and the border sub-plates, the horizontal position-limiting units including recesses, the recesses in the adjacent sub-plates being adapted to each other, and a gap being preset between inner walls of borders of every adjacent sub-plates;

further, vertical position-limiting units are also arranged on adjacent borders, the vertical position-limiting units including protrusions that are formed on upper sides and/or lower sides of the adjacent borders respectively and are capable of clamping the adjacent borders.

In one embodiment, outer edges of the borders provided with the recesses are configured with rounded angles.

In one embodiment, the central-axis sub-plate, the intermediate sub-plates and the border sub-plates have the same heights in a vertical direction; the central-axis sub-plate, the intermediate sub-plates and the border sub-plates have the same thicknesses; and the central-axis sub-plate, the intermediate sub-plates and the border sub-plates have the same widths, or the width of the central-axis sub-plate is larger than the width of the intermediate sub-plates and the width of the border sub-plates.

In one embodiment, the central-axis sub-plate, the intermediate sub-plates and the border sub-plates are all formed by a carbon fiber material.

In one embodiment, the display device further includes a power module and a transmission module, wherein the transmission module is arranged on a back of the border sub-plates; the power module is arranged on the support, and a power output portion of the power module is in contact with the transmission module; and the power module drives the transmission module, and the transmission module drives borders of the back plate to move forward or backward.

In one embodiment, the power module includes motors, and the transmission module includes a slide rail arranged on the back of the border sub-plates and sliding blocks capable of sliding along the slide rail; and the motors are arranged in regions of the support corresponding to the border sub-plates, and output shafts of the motors are connected to the sliding blocks.

In one embodiment, the motors are piston-type motors, and the extending direction of the slide rail is perpendicular to the vertical axis of the central-axis sub-plate.

In one embodiment, the display device further includes a shaping module, which is fixedly connected to the border sub-plates and movably connected to the central-axis sub-plate and the intermediate sub-plates respectively.

In one embodiment, the shaping module includes a chain or an elastic strip; an extending direction of the chain or the elastic strip is perpendicular to the vertical axis of the central-axis sub-plate; and the chain or the elastic strip is fixedly connected to the border sub-plates, and movably connected to the borders on both sides of the central-axis sub-plate and the intermediate sub-plates respectively.

In one embodiment, the display screen is in bonded connection with the central-axis sub-plate, the intermediate sub-plates and the border sub-plates respectively.

In one embodiment, middle vertical regions of the central-axis sub-plate, the intermediate sub-plates and the border sub-plates are provided with an adhesive respectively, and the display screen is connected to the central-axis sub-plate, the intermediate sub-plates and the border sub-plates through the adhesives respectively.

In one embodiment, the display device further includes a Tcon board, an SOC board, a power board and speakers, and the Tcon board, the SOC board, the power board and the speakers are arranged on the support.

In one embodiment, the support is formed by a metal material, and the support is provided with reinforcing ribs on the back.

In one embodiment, the display device further includes a front frame, a back cover and a seat, wherein the front frame is arranged on borders of the front side of the display screen and is in bonded connection with the display screen; and the back cover is located behind the support, and the back cover and the seat are connected to the central-axis sub-plate.

The present invention has the following beneficial effects: a main body of the display device includes a back plate formed by splicing a plurality of sub-plates, and a support, wherein the front side of the back plate is stuck to the display screen; a shaping module, the support and a transmission module are fixed to the back side of the back plate; the power module is fixed to the support; the power module drives the transmission module, and the transmission module drives both sides of the back plate to move, so that the whole back plate forms a curved surface, thus causing the display screen to be bent to form a curved surface, thereby achieving flat-curved state conversion of the display screen of the display device, while implementing both curved display and flat display, so that the display device implements various viewing modes and meets different demands of all kinds of people.

BRIEF DESCRIPTION OF THE DRAWINGS

FIG. 4 is a schematic diagram of the structure of a back plate in FIG. 2, wherein:

FIG. 5 is a schematic diagram of the structure of a power module in FIG. 2, wherein:

FIG. 8 is a schematic diagram of assembling the back plate and the support in FIG. 2, wherein:

FIG. 9 is a schematic diagram of the structure of the motor assembled on the support in FIG. 2, wherein:

DETAILED DESCRIPTION OF THE EMBODIMENTS

To make the person skilled in the art better understand the technical solution of the present invention, the display device of the present invention is further described below in detail in conjunction with the accompanying drawings and the specific implementations.

Figure 1:
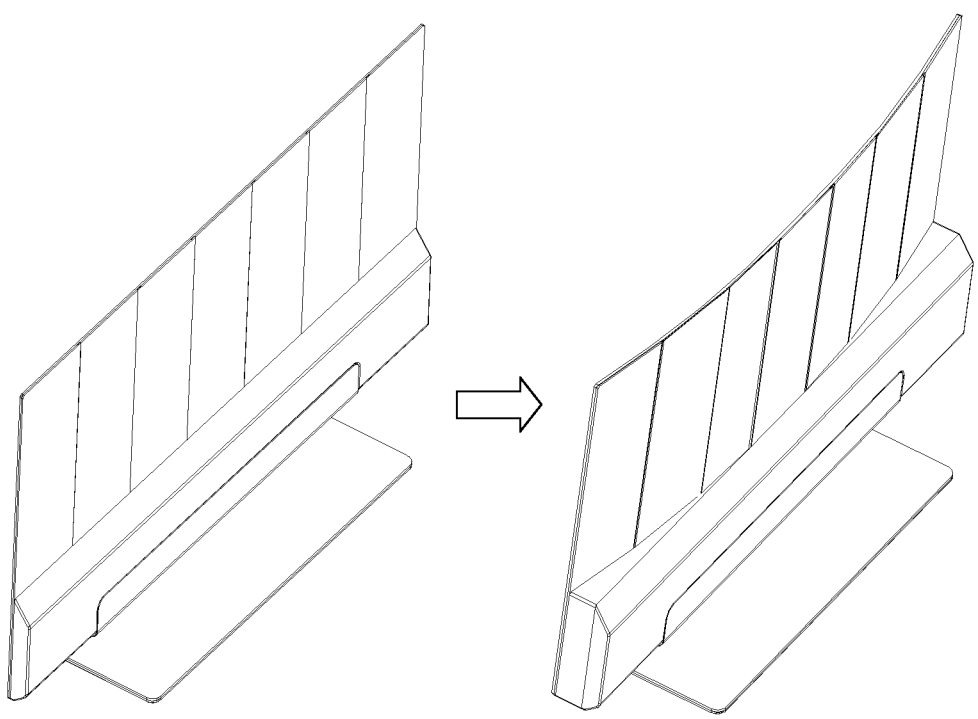
FIG. 1 is a schematic diagram of the conversion of a display device in an embodiment of the present invention from a flat state to a curved state.

Embodiment 1:

The present invention provides a display device, as shown in FIG. 1, which is a schematic diagram of the display device converted from a flat state to a curved state, wherein in the flat state, the display device has a large viewing angle and can be viewed by many persons at the same time; and in the curved state, the display device has good viewing effect and can be viewed by a few persons, who can enjoy the effect like in a cinema. In the embodiment, as the display device can be converted between the two states at will and implements both curved display and flat display, the display device achieves multiple viewing effects, thus meeting different demands of all kinds of people.

Figure 2:
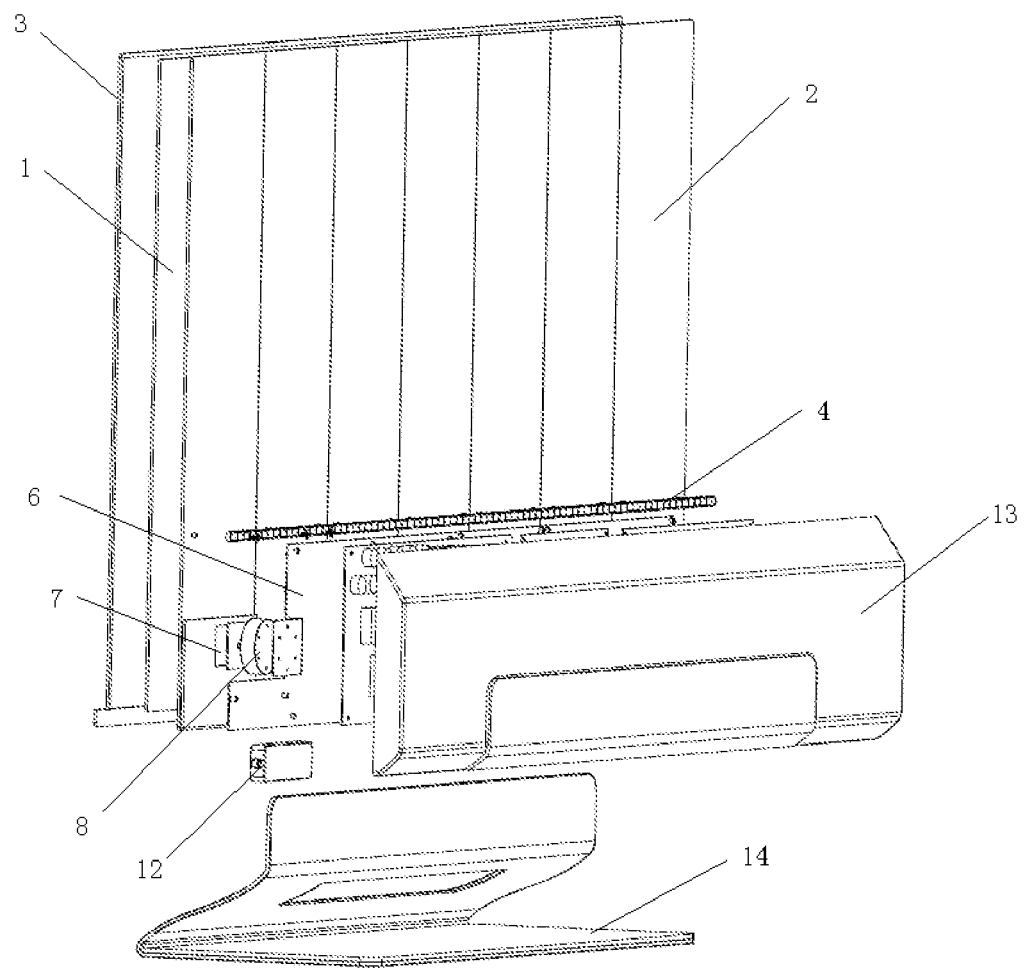
FIG. 2 is a schematic diagram of the structure of a display device in an embodiment of the present invention.
Figure 3:
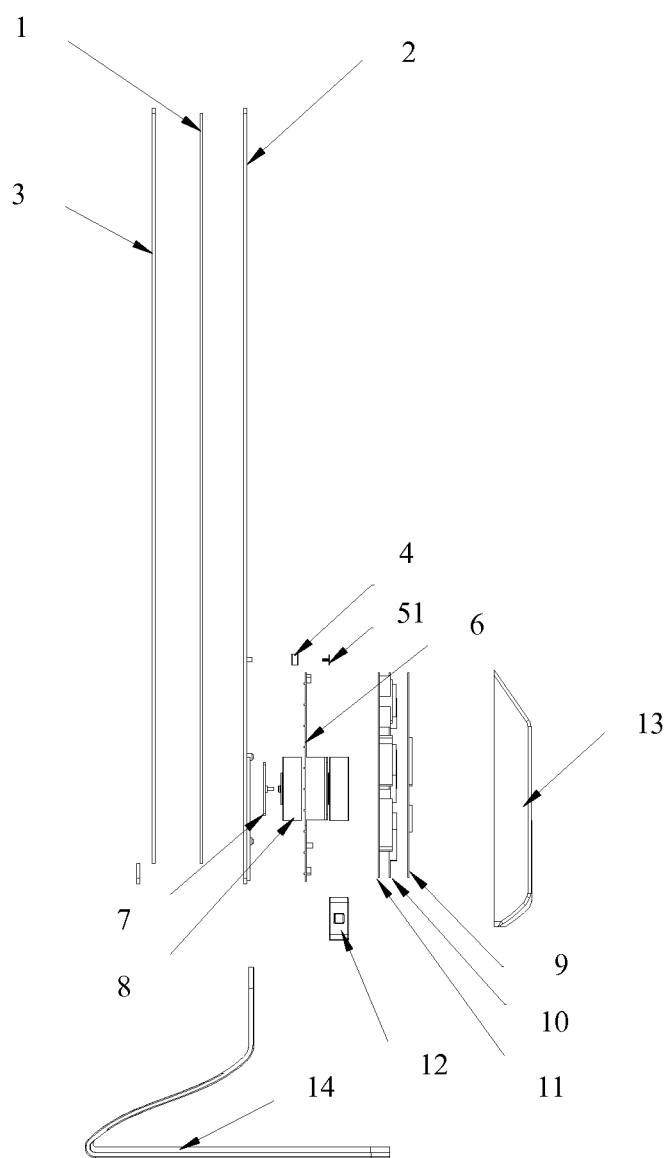
FIG. 3 is a side exploded view of the display device in FIG. 2.

As shown in FIGS. 2 and 3, in the embodiment, the display device includes a display screen 1 and a back plate 2 arranged on the back of the display screen 1, and further includes a support 6, the back plate 2 being arranged on the support 6; the back plate 2 is a spliced back plate, and the display screen 1 is a flexible display screen; and the back plate 2 allows the display screen 1 to be converted between curved display and flat display. In the embodiment, the display device can implement the conversion from the flat state to the curved state primarily through the spliced back plate 2 and the support 6; in order to achieve automatic switching from the flat state to the curved state, the display device may further include a power module and a transmission module; to obtain a display screen with a more natural bent curve and achieve better curved display effect, the display device may further include a shaping module, etc.

Figure 4A:
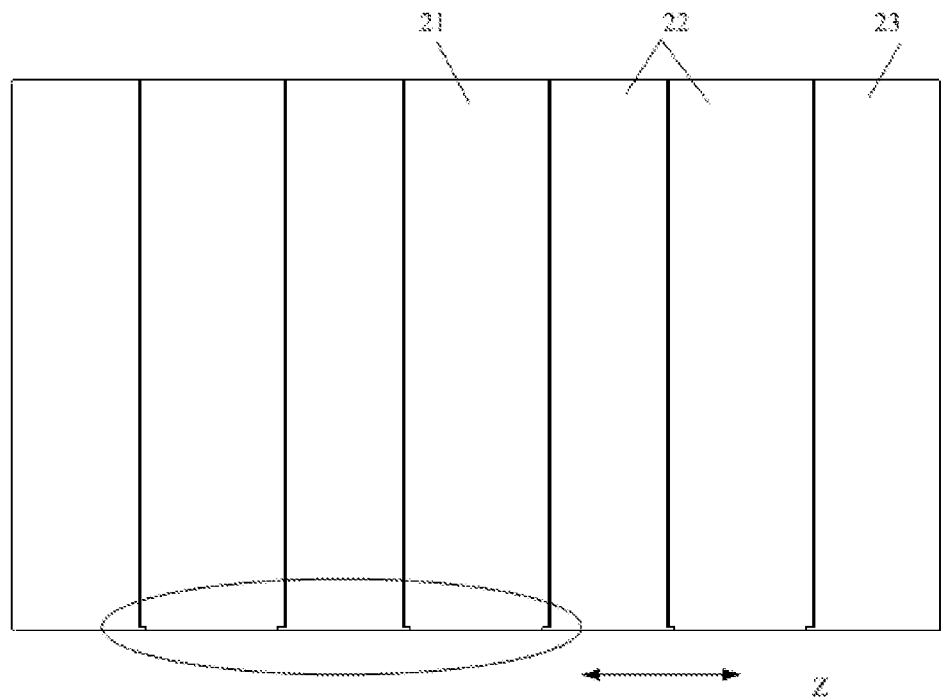
FIG. 4(a) is a main view of the back plate.

In the embodiment, in order to achieve bendable function of the back plate 2, an integrally designed back plate in an existing display device is changed to a back plate formed by splicing a plurality of sub-plates into a whole. In the embodiment, taking a back plate 2 composed of seven plates as an example, a first sub-plate, a second sub-plate, a third sub-plate, a fourth sub-plate, a fifth sub-plate, a sixth sub-plate and a seventh sub-plate are successively connected in a spliced manner in sequence. Specifically, as shown in FIG. 4(a), the back plate 2 includes a central-axis sub-plate 21, intermediate sub-plates 22 and border sub-plates 23, wherein the central-axis sub-plate 21 is arranged in a vertical central region of the display screen 1 and connected with the support 6; the plurality of intermediate sub-plates 22 are symmetrically distributed along a horizontal direction of the central-axis sub-plate 21 about a vertical axis of the central-axis sub-plate 21 as a symmetry axis; the border sub-plates 23 are arranged on the outer sides of the intermediate sub-plates 22 away from the central-axis sub-plate 21; and the central-axis sub-plate 21, the plurality of intermediate sub-plates 22 and the border sub-plates 23 are movably connected.

To ensure relatively fixed positions of the sub-plates in the back plate, horizontal position-limiting units are arranged on borders of adjacent sub-plates, among the central-axis sub-plate 21, the plurality of intermediate sub-plates 22 and the border sub-plates 23, the horizontal position-limiting units including recesses, the recesses in the adjacent sub-plates being adapted to each other, and a gap being preset between inner walls of borders of every adjacent sub-plates; and the outer edges of the borders provided with the recesses are configured with rounded angles. Further, vertical position-limiting units are also arranged on adjacent borders, the vertical position-limiting units including protrusions that are formed on upper sides and/or lower sides of the adjacent borders respectively and are capable of clamping the adjacent borders. Here, a front side means the side of the sub-plates facing the display screen 1, and a back side means the side of the sub-plates away from the display screen 1.

Figure 4B:
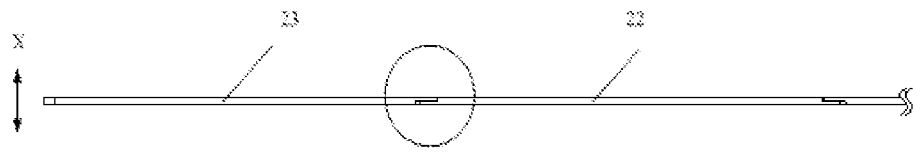
FIG. 4(b) is a top view of the back plate.
Figure 4C:
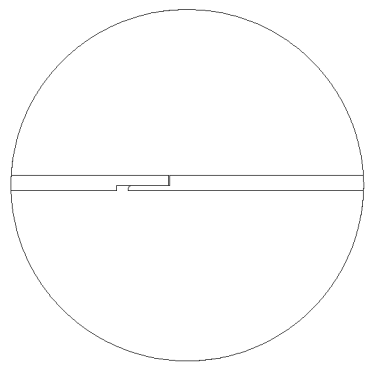
FIGS. 4(c) and (d) are partial enlarged top views of a horizontal position-limiting unit of the back plate in FIG. 4(a)
Figure 4D:
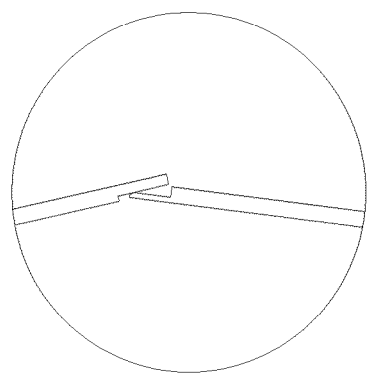

As shown in FIG. 4(b), the first sub-plate is a border sub-plate 23 (leftmost plate here) of the back plate 2, and the second sub-plate is an intermediate sub-plate 22 adjacent to the border sub-plate. Wherein, in the horizontal position-limiting units, a recess is formed on the right front side of the first sub-plate, and a recess is formed on both the left back side and the right back side of the second sub-plate; as shown in the partial enlarged view in FIG. 4(c), bottom surfaces of two recesses between the adjacent sub-plates are fit to each other, that is, the bottom surface of the recess on the left back side of the second sub-plate cooperates with the bottom surface of the recess on the right front side of the first sub-plate, so that the first sub-plate and the second sub-plate are limited in the horizontal direction; further, all the sub-plates have a similar structure, thus ensuring limiting of the positions of the sub-plates in the horizontal direction, thereby restricting the adjacent sub-plates from relative movement in the front and back direction (X direction); in addition, as a certain distance is retained between adjacent sub-plates, for example, a gap of about 0.3 mm is preset, that is, a border of only one of any two adjacent sub-plates abuts against a border of the other sub-plate formed with a recess, thereby restricting the adjacent sub-plates from relative movement in the left and right direction (Z direction). Further, edges of borders of the second sub-plate formed with recesses are designed to have rounded angles, and as a gap is formed between the recess on the border of the second sub-plate and the recess on the border of the first sub-plate so that the borders are spaced apart, an angle is formed there between about a rounded angle portion as a pivot point, as shown in FIG. 4(d), during deformation from the flat state to the curved state, thus, the adjacent spliced sub-plates can be staggered with respect to each other during curved deformation, so that the display screen becomes curved.

Figure 4E:
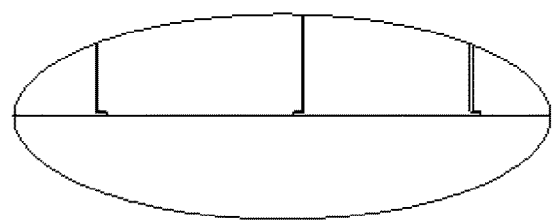
FIG. 4(e) is a partial enlarged front view of a vertical position-limiting unit of the back plate in FIG. 4(b)

In the vertical position-limiting units, as shown in FIG. 4(e), one of two adjacent sub-plates is provided with a protrusion on the lowermost left side or right side, and the protrusion can clamp the adjacent border, and restricts the adjacent sub-plate from relative movement in the vertical direction (Y direction). Of course, if there are adjacent sub-plates located on the left side and right side of the sub-plate, a protrusion is formed on each of the lowermost left side and right side of the sub-plate respectively, to restrict the adjacent sub-plates on the left side and right side of the sub-plate from relative movement in the vertical direction (Y direction).

In the embodiment, all the borders of the sub-plates of the back plate have the structure described above; and it would be readily inferable that the position limiting process and the position evading process (by using the rounded angles) of the sub-plates of the back plate with adjacent relation are the same as described above. During assembly of the back plate of the display device, all the sub-plates are successively inserted into assembled limiting structures of adjacent sub-plates. Taking the back plate with seven sub-plates in FIG. 4(a) as an example, the first to seventh sub-plates are successively inserted into assembled limiting structures of adjacent sub-plates, finally forming the back plate. Of course, it is also possible to assemble the first border sub-plate 23 at first, or assemble the seventh border sub-plate 23 at first, or assemble the fourth central-axis sub-plate 21 at first, or even assemble any intermediate sub-plate 22 at first, which is not limited herein, and flexible arrangement can be made during assembly according to habits of the operator or conditions of equipment.

Here, it should be understood that the number of intermediate sub-plates forming the back plate is not limited in the embodiment, and taking a 55" display screen as an example, the back plate in FIG. 4 is formed by splicing seven sub-plates. The number and width of the sub-plates can be configured flexibly according to different dimensions of display screens and different bending radii of display screens in the curved state, and are not limited herein.

To simplify the manufacturing process of the back plate, the heights of the central-axis sub-plate 21, the intermediate sub-plates 22 and the border sub-plates 23 in the vertical direction are same; the thicknesses of the central-axis sub-plate 21, the intermediate sub-plates 22 and the border sub-plates 23 are same; and the widths of the central-axis sub-plate 21, the intermediate sub-plates 22 and the border sub-plates 23 are same, or the width of the central-axis sub-plate 21 is larger than the width of the intermediate sub-plates 22 and the width of the border sub-plates 23.

In the embodiment, the central-axis sub-plate 21, the intermediate sub-plates 22 and the border sub-plates 23 are all formed by a carbon fiber material. The back plate formed by the carbon fiber material has a high strength, good flatness and a relatively light weight.

As shown in FIGS. 2 and 3, the display device in the embodiment further includes a power module and a transmission module, wherein the transmission module is arranged on the back of the border sub-plates 23 (here the back means the face of the sub-plates away from the display screen 1); the power module is arranged on the support 6, and a power output portion of the power module is in contact with the transmission module; through the transmission module, the power module drives borders of the back plate 2 (as well as the border sub-plates 23 and the intermediate sub-plates 22) to move forward or backward, while the central-axis sub-plate 21 is kept motionless, so that the display screen 1 becomes curved or retains in flat state.

Wherein, the power module includes motors 8, and the transmission module includes a slide rail (not shown in FIG. 2) arranged on the back of the border sub-plates and sliding blocks 7 arranged cooperatively with the slide rail, the sliding blocks 7 being capable of sliding along the slide rail; and the motors 8 are arranged in regions of the support 6 corresponding to the border sub-plates 23, and output shafts of the motors 8 are connected to the sliding blocks 7. Specifically, the motors 8 are piston-type motors, supply bending power to the back plate 2 through the sliding blocks 7, and have relatively stable output power. The extending direction of the slide rail is perpendicular to the vertical axis of the central-axis sub-plate 21, to ensure balance of output power of the motors 8.

Figure 5A:
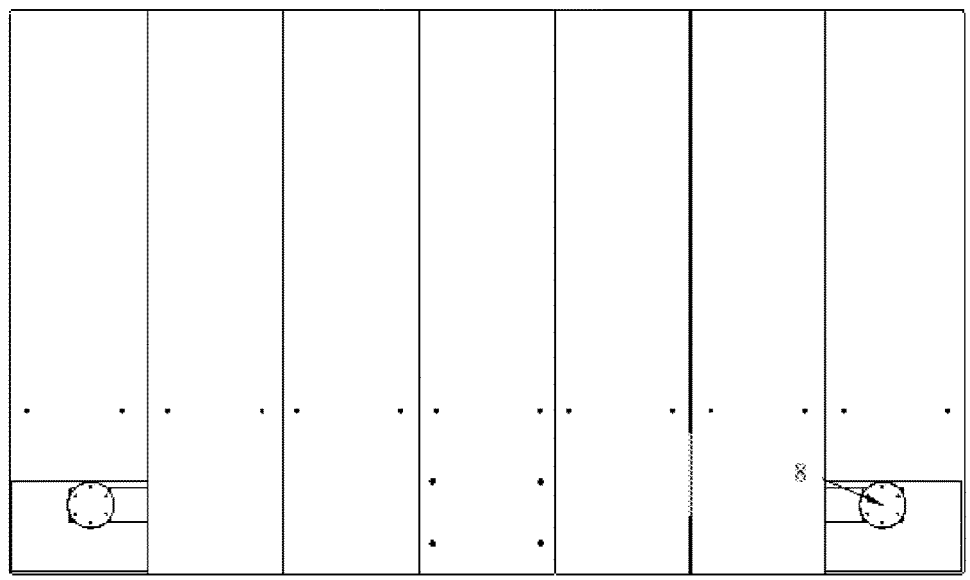
FIG. 5(a) is a schematic diagram of a motor mounted on the back of the back plate.
Figure 5B:
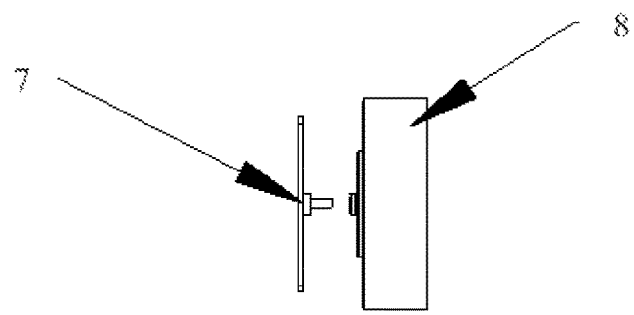
FIG. 5(b) is a schematic diagram of a cooperative structure of the motor and a sliding block.

Still taking the back plate in FIG. 4(a) as an example, as shown in FIG. 5(a), pneumatic power devices are arranged on the back of the first sub-plate and the seventh sub-plate as power sources, that is, the first sub-plate and the seventh sub-plate are each provided with a piston-type pneumatic motor at the lower part, and after powered on, the piston-type pneumatic motor provides power to the back plate 2 and controls deformation action of the back plate 2 according to a set scheme; and as shown in FIG. 5(b), output shafts of the motors 8 and the sliding blocks 7 are assembled together.

Figure 6:
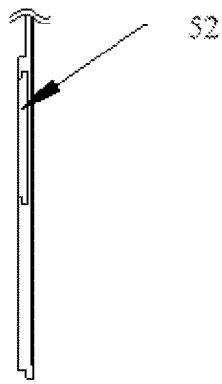
FIG. 6 is a schematic diagram of the sliding block mounted on the back plate in FIG. 2.

Wherein, as shown in FIG. 6, the sliding blocks 7 are inserted into the back plate 2 through the slide rail (similar to insertion slot 52) on the back plate 2, and the sliding blocks 7 can move left and right within the slide rail; the sliding blocks 7 are in direct contact with the output shafts of the motors 8; and linear step-by-step outputs of the piston-type pneumatic motors are transferred to the sliding blocks 7 through the output shafts, i.e. the linear step-by-step outputs are transferred to the back plate 2.

Here, it should be understood that power source devices other than motors may also be adopted in the power module, and their positions on the support may also be configured flexibly according to wiring layout, which is not described herein in detail.

Figure 7:
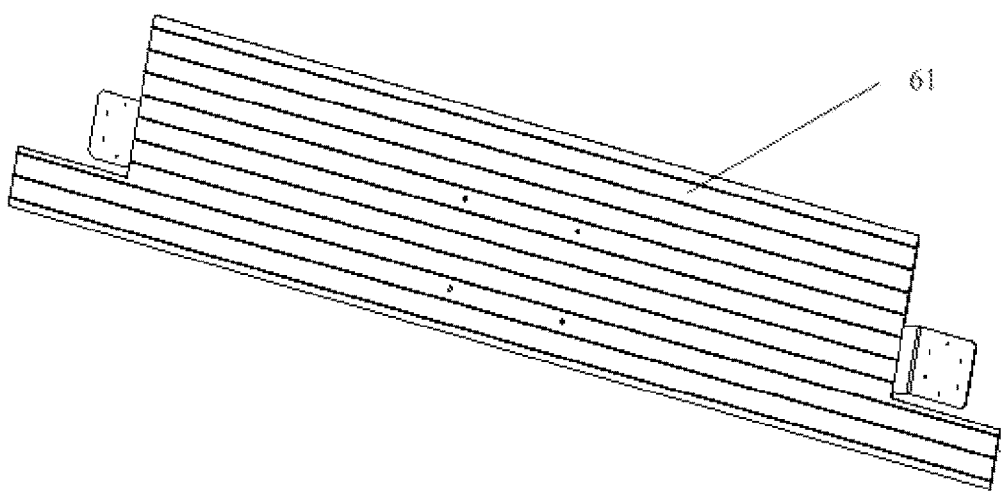
FIG. 7 is a schematic diagram of the structure of a support in FIG. 2.

In the embodiment, the support 6 is formed by a metal material, and as shown in FIG. 7, the support 6 is provided with reinforcing ribs 61 on the back. With a relatively large length, the support 6 may be deformed in the length direction, and adopting the metal material and adding the reinforcing ribs 61 on the back can effectively improve the strength of the support 6 and prevent deformation.

Figure 8A:
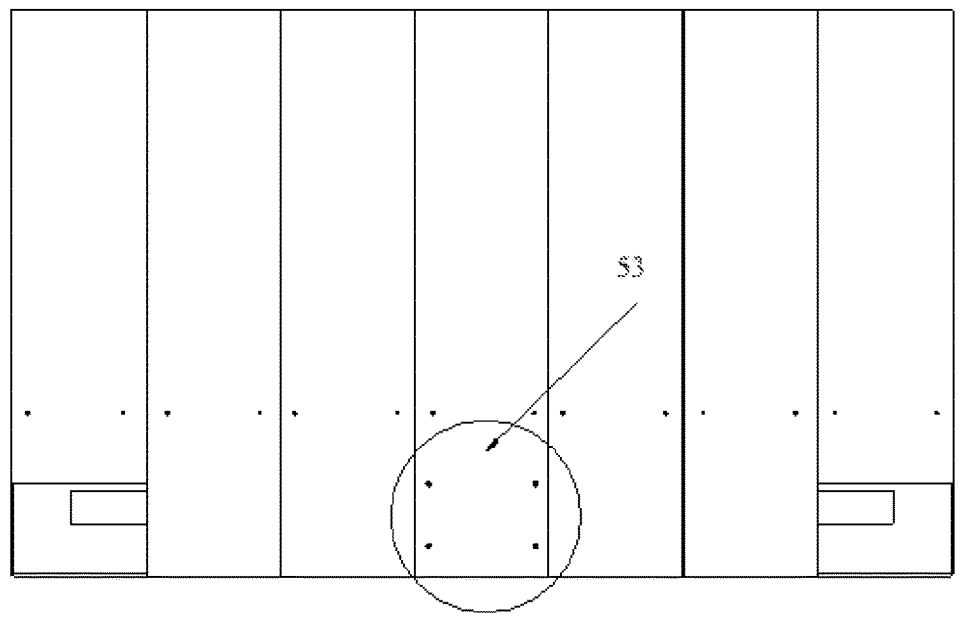
FIG. 8(a) is a schematic diagram of a support mounting structure preset on the back of the back plate.
Figure 8B:
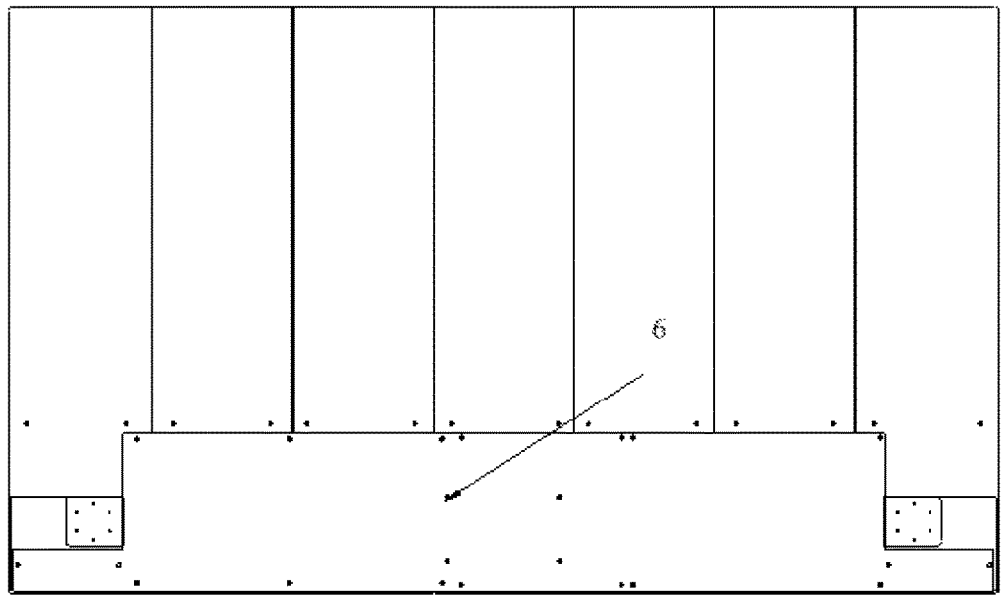
FIG. 8(b) is a schematic diagram of the structure of the support mounted on the back of the back plate.
Figure 9A:
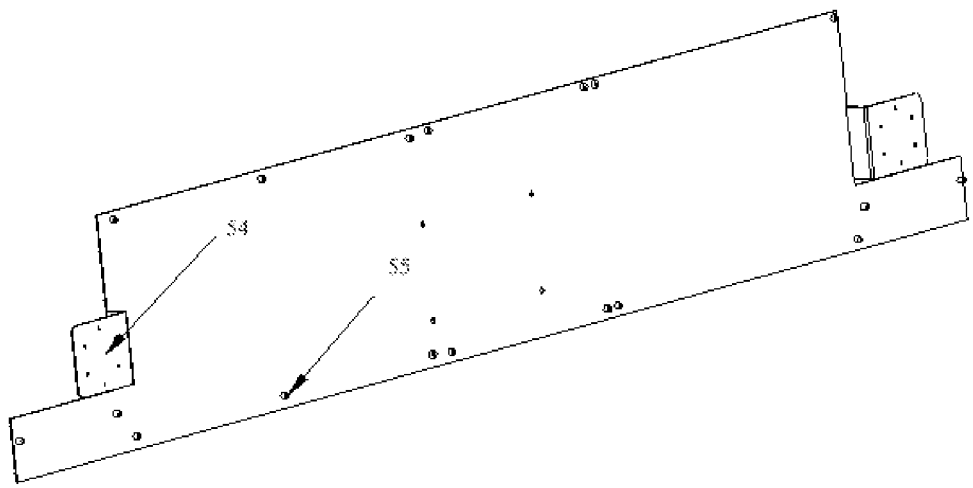
FIG. 9(a) is a schematic diagram of a motor mounting structure preset on the support.
Figure 9B:
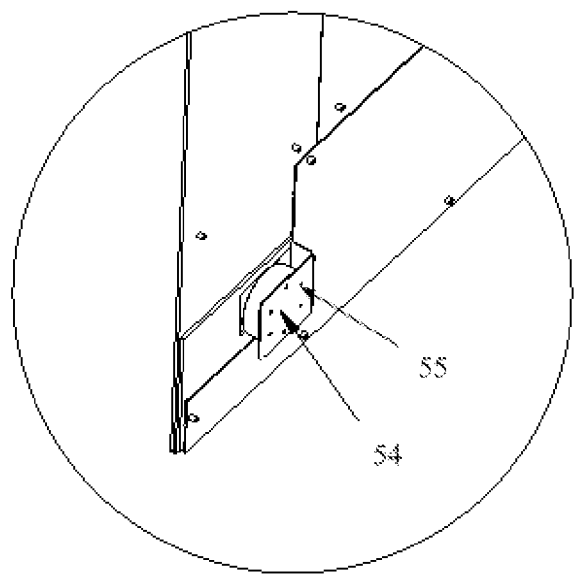
FIG. 9(b) is a schematic diagram (partial) of the structure of the motor mounted on the support.
Figure 10:
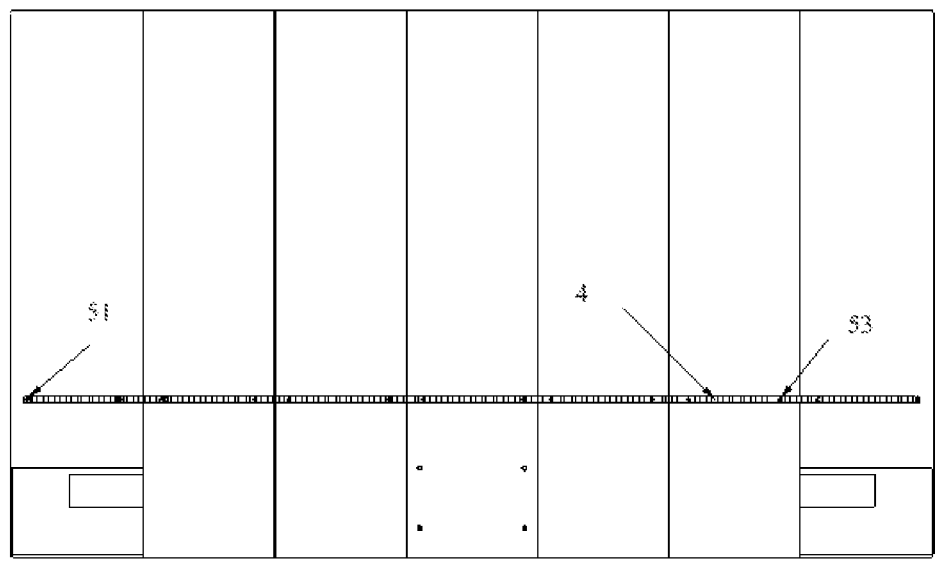
FIG. 10 is a schematic diagram of a fixing structure for a chain in FIG. 2.

In the display device, the support 6 plays the role of supporting main devices, such as connecting the back plate, fixing the motors, and providing a fixing module for conversion between the flat state and the curved state of the display screen 1. Specifically, as shown in FIGS. 8(a) and 8(b), four holes are formed in the central-axis sub-plate 21 of the back plate 2, and the support 6 is fixed to the central-axis sub-plate 21 through four nuts 53; as shown in FIGS. 9(a) and 9(b), regions at both sides of the front face (here the front face means the face of the support 6 facing the display screen 1) of the support 6 corresponding to the border sub-plates 23 are each provided with a mounting plate 54 (equivalent to a protrusion structure), six holes 55 being formed on the surface of the protrusion structure, for fixing the motors 8; and in fixing of the motors 8, the motors 8 are locked to the support 6 through screws (not shown in the figures).

It can be seen from the above structure that the motors 8 are locked to the support 6, and the support 6 is in turn locked to the middlemost central-axis sub-plate 21, so the middlemost central-axis sub-plate 21 and the support 6 are both kept in a static state when the motors 8 provide power for forward or backward movement, while the border sub-plates 23 make forward or backward movement, driven by the motors 8. As the border sub-plates 23 and the intermediate sub-plates 23 are connected in a spliced manner, the intermediate sub-plates 22 can be in turn driven to make forward or backward movement, thereby bringing the display screen 1 into the curved state.

Specifically, during transmission, the motors 8 drive the sliding blocks 7 to make forward or backward movement, and in turn drive the border sub-plates 23 of the back plate 2 to make forward or backward movement, that is, the sliding blocks 7 can push forward the first sub-plate and the seventh sub-plate located on the borders of the back plate 2 to move forward, and drive the second sub-plate, the third sub-plate, the fifth sub-plate and the sixth sub-plate respectively to move forward. As the fourth sub-plate located in the middlemost position of the back plate 2 is motionless, symmetrical curved movement of the border sub-plates 23 and the intermediate sub-plates 22 about the central-axis sub-plate 21 as the center is generated, forming the back plate 2 in the curved state, so that the display screen 1 becomes curved.

To form a natural curve, the display device of the embodiment further includes a shaping module, which is fixedly connected to the border sub-plates 23, and movably connected to the central-axis sub-plate 21 and the intermediate sub-plates 22 respectively. Specifically, the shaping module includes a chain 4, which is fixedly connected to the border sub-plates 23, and movably connected to the central-axis sub-plate 21 and the intermediate sub-plates 22 respectively, and the extending direction of the chain 4 is perpendicular to the vertical axis of the central-axis sub-plate 21. The chain 4 is equivalent to a restricting line, such that when the two sub-plates on the outermost sides of the back plate 2 are moved under force, a natural curve can be formed, and when the two sub-plates on the outermost sides are moved by the power of the motors 8, the seven sub-plates can make curvilinear movement to form a curved surface, i.e. making the back plate 2 form a natural curved surface.

In the embodiment, nuts 53 are provided on the backs of both the central-axis sub-plate 21 and the intermediate sub-plates 22; and to assemble the chain 4, the chain 4 is clamped on the nuts 53 and locked slightly by fixing screws (i.e. fixed by screws which are however not tightened), so that the chain 4 cannot drop off from the back of the back plate but still can be moved and adjusted slightly in the extending direction of the chain 4, such that the chain 4 and the back plate 2 form a whole, and the chain 4 brings the back plate 2 into motion to form a natural curved surface. That is, the chain 4 is locked and fixed slightly by the screws, so that the chain 4 can be adjusted slightly during movement, to make the curved surface more natural. Of course, the chain 4 may also be enclosed and fixed to the sub-plates by a movable sleeve, so that a certain margin for movement can be retained while the chain 4 is fixed to the back plate.

In the embodiment, the chain 4 is movably connected to the borders on both sides of the central-axis sub-plate 21 and the intermediate sub-plates 22 respectively. As the chain 4 has two connecting points with each sub-plate, on the one hand the connection is relatively firm, and on the other hand it ensures that no warping is generated between each sub-plate and the chain 4, to obtain a relatively continuous shape of the back plate 2.

Here, it should be understood that the shaping module in the embodiment can also function, to some degree, to ensure relatively fixed positions of the sub-plates of the back plate 2 and further ensure integrity of the back plate 2. When sufficient sub-plates are used in the back plate 2, and engagement between adjacent sub-plates can result in strict curved cooperation, it is also possible to omit the shaping module, and at the same time make some improvement on the engagement structure between the adjacent sub-plates; or the shaping module may also adopt a restricting line other than a chain, and its mounting position on the back plate may also be configured flexibly according to wiring layout, for example, the shaping module may also include an elastic strip, the extending direction of which is perpendicular to the vertical axis of the central-axis sub-plate, and the elastic strip is fixedly connected to the border sub-plates and movably connected to the borders on both sides of the central-axis sub-plate and the intermediate sub-plates respectively. By adopting the elastic strip restricting line, the back plate 2 can also form a natural curved surface, which is not described herein in detail.

In the embodiment, the display screen 1 is a flexible display screen, such as OLED (Organic Light-Emitting Diode). An OLED display device has the advantages of being self-luminous, fast in response speed, wide in viewing angle, etc., and can be used in various applications such as flexible display, transparent display, 3D display, etc. Currently, in large panel manufacturers, both large-size OLED screens and flexible screens are important objects of research and development, showing a development trend of future panel industry. With the flexible screen or OLED screen, the embodiment integrates two states including flat display and curved display of the display device, and implements a bendable display device that can be converted between the two states, namely the flat state and the curved state, thus meeting different demands of users.

Figure 11:
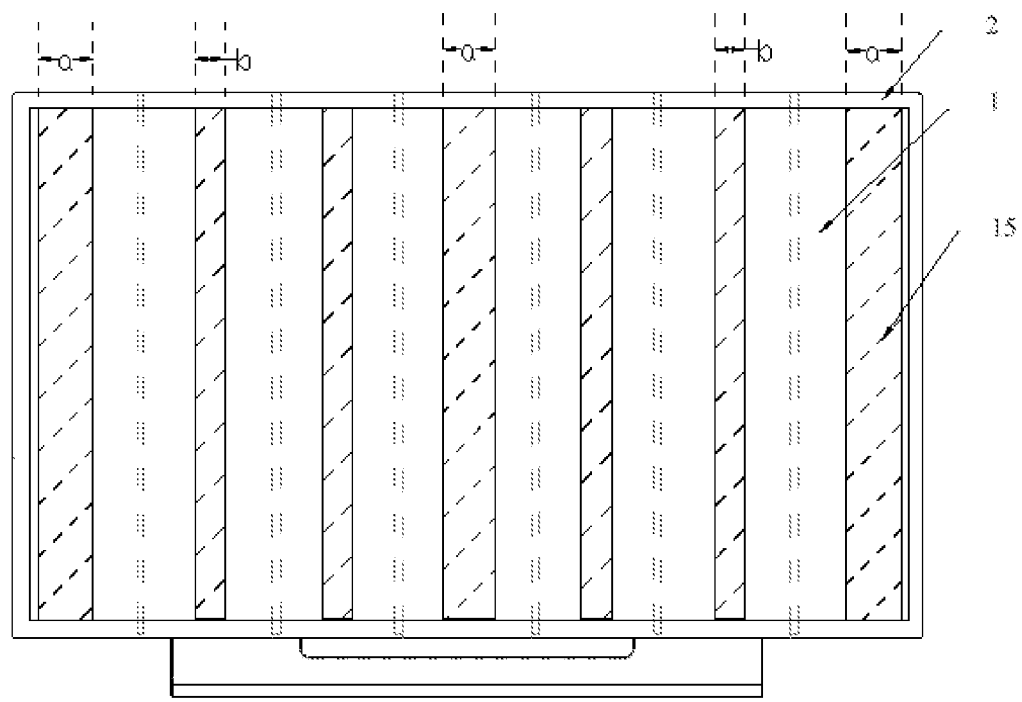
FIG. 11 is a schematic diagram of sticking the display screen in FIG. 2.

In the display device of the embodiment, the display screen 1 are in bonded connection with the back plate 2, that is, the display screen 1 is in bonded connection with the central-axis sub-plate 21, the intermediate sub-plates 22 and the border sub-plates 23 respectively. After assembly of the back plate 2 is completed, the back plate 2 can be stuck and connected to the display screen 1. As shown in FIG. 11, middle vertical regions of the central-axis sub-plate 21, the intermediate sub-plates 22 and the border sub-plates 23 are provided with an adhesive 15, and the display screen 1 is connected to the central-axis sub-plate 21, the intermediate sub-plates 22 and the border sub-plates 23 through the adhesive 15, and in order to achieve firmer bonding effect, the width of adhesive regions on portions, which are in contact with the display screen 1, of the border sub-plates 23 located on both sides of the back plate 2 is a, and the width of the adhesive on a portion, which is in contact with the display screen 1, of the central-axis sub-plate 21 arranged in the middlemost position of the back plate 2 is also a, and the width of the adhesives on portions of the intermediate sub-plates 22 in contact with the display screen 1 is b, where a>b. As the adhesive 15 is only provided in the middle regions of the sub-plates (instead of the whole backs of the sub-plates), forming a linear connection, on the one hand the sub-plates can have a relatively large margin for movement with respect to the support 6, to ensure that the effect of a smooth curved surface with relative bending between the sub-plates can be achieved; and on the other hand the sub-plates achieve more uniform bonding effect relative to the support 6, further ensuring relatively fixed positions of the sub-plates of the back plate 2 and ensuring integrity of the back plate 2.

Figure 12:
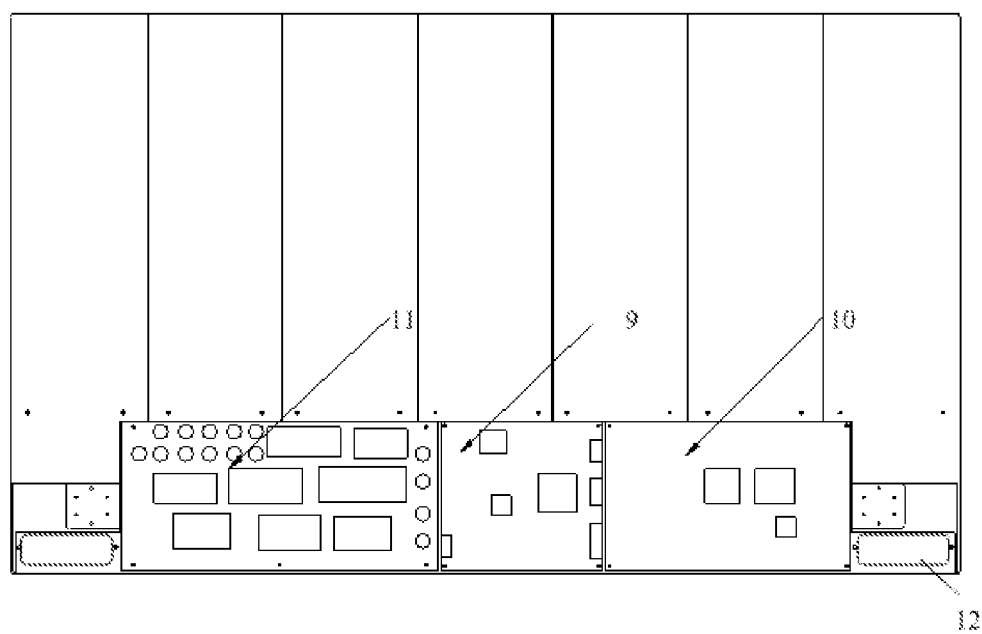
FIG. 12 is a schematic diagram of the structure of other components on the support in FIG. 2.

It is easy to understand that, as shown in FIG. 12, the display device of the embodiment further includes a Tcon board 9, a system (SOC) board 10, a power board 11 and speakers 12 that are necessary for the display device, and the Tcon board 9, the SOC board 10, the power board 11 and the speakers 12 are arranged on the support 6. That is, the power board, the system board and the Tcon board needed by the complete display device are attached to the support 6 through screws; and the speakers 12 are fixed on both sides of a lowermost portion of the support 6, making the overall layout compact and saving space.

As shown in FIGS. 2 and 3, the display device of the embodiment further includes a front frame 3, a back cover 13 and a seat 14, wherein the front frame 3 is arranged on borders of the front side of the display screen 1 and is in bonded connection with the display screen 1; and the back cover 13 is located behind the support 6, and the back cover 13 and the seat 14 are connected to the central-axis sub-plate 21 (i.e. the seat is connected with the back plate structure), forming a fixed whole structure.

The display device in the embodiment of the present invention may be electronic paper, an OLED panel, a mobile phone, a tablet computer, a television, a display, a notebook computer, a digital photo frame, a navigator, or any other product or component with a display function.

A main body of the display device of the present invention includes a back plate formed by splicing a plurality of sub-plates, and a support, wherein the front side of the back plate is stuck to the display screen; a shaping module, the support and a transmission module are fixed to the back side of the back plate; a power module is fixed to the support; the power module drives the transmission module, and the transmission module drives both sides of the back plate to move, so that the whole back plate forms a curved surface, thus causing the display screen to be bent to form a curved surface, thereby achieving flat-curved state conversion of the display screen of the display device, while implementing both curved display and flat display, so that the display device implements various viewing modes and meets different demands of all kinds of people.

It should be understood that the above implementations are only exemplary implementations for illustrating the principle of the present invention, however, the present invention is not limited thereto. Various modifications and improvements can be made by the person of ordinary skill in the art without departing from the spirit and essence of the present invention, and these modifications and improvements should also be considered to be within the protection scope of the present invention.

The invention claimed is:

1. A display device, comprising a display screen, a back plate arranged on a back of the display screen, and a support, the back plate being arranged on the support, wherein the back plate is a spliced back plate, and the display screen is a flexible display screen; and the back plate allows the display screen to be converted between a curved display state and a flat display state, the display device is characterized in that the back plate comprises a central-axis sub-plate, intermediate sub-plates and border sub-plates; the central-axis sub-plate is arranged in a vertical central region of the display screen and connected with the support; the plurality of intermediate sub-plates are symmetrically distributed along a horizontal direction of the central-axis sub-plate about a vertical axis of the central-axis sub-plate as a symmetry axis; the border sub-plates are arranged on outer sides of the intermediate sub-plates away from the central-axis sub-plate; and the central-axis sub-plate, the plurality of intermediate sub-plates and the border sub-plates are movably connected.

2. The display device according to claim 1, wherein horizontal position-limiting units are arranged on borders of adjacent sub-plates, among the central-axis sub-plate, the plurality of intermediate sub-plates and the border sub-plates, the horizontal position-limiting units comprising recesses, the recesses in the adjacent sub-plates being adapted to each other, and a gap being preset between inner walls of borders of every adjacent sub-plates;

and further, vertical position-limiting units are also arranged on adjacent borders, the vertical position-limiting units comprising protrusions that are formed on upper sides and/or lower sides of the adjacent borders respectively and are capable of clamping the adjacent borders.

3. The display device according to claim 2, wherein outer edges of the borders provided with the recesses are configured with rounded angles.

4. The display device according to claim 3, further comprising a front frame, a back cover and a seat, wherein the front frame is arranged on borders of the front side of the display screen and is in bonded connection with the display screen; and the back cover is located behind the support, and the back cover and the seat are connected to the central-axis sub-plate.

5. The display device according to claim 2, further comprising a front frame, a back cover and a seat, wherein the front frame is arranged on borders of the front side of the display screen and is in bonded connection with the display screen; and the back cover is located behind the support, and the back cover and the seat are connected to the central-axis sub-plate.

6. The display device according to claim 1, wherein the central-axis sub-plate, the intermediate sub-plates and the border sub-plates have the same heights in a vertical direction; the central-axis sub-plate, the intermediate sub-plates and the border sub-plates have the same thicknesses; and the central-axis sub-plate, the intermediate sub-plates and the border sub-plates have the same widths, or the width of the central-axis sub-plate is larger than the width of the intermediate sub-plates and the width of the border sub-plates.

7. The display device according to claim 6, further comprising a front frame, a back cover and a seat, wherein the front frame is arranged on borders of the front side of the display screen and is in bonded connection with the display screen; and the back cover is located behind the support, and the back cover and the seat are connected to the central-axis sub-plate.

8. The display device according to claim 1, wherein the central-axis sub-plate, the intermediate sub-plates and the border sub-plates are all formed by a carbon fiber material.

9. The display device according to claim 1, further comprising a power module and a transmission module, wherein the transmission module is arranged on a back of the border sub-plates; the power module is arranged on the support, and a power output portion of the power module is in contact with the transmission module; and the power module drives the transmission module, and the transmission module drives borders of the back plate to move forward or backward.

10. The display device according to claim 9, wherein the power module comprises motors, and the transmission module comprises a slide rail arranged on the back of the border sub-plates and sliding blocks sliding along the slide rail; and the motors are arranged in regions of the support corresponding to the border sub-plates, and output shafts of the motors are connected to the sliding blocks.

11. The display device according to claim 10, wherein the motors are piston-type motors, and the extending direction of the slide rail is perpendicular to the vertical axis of the central-axis sub-plate.

12. The display device according to claim 1, further comprising a shaping module, which is fixedly connected to the border sub-plates and movably connected to the central-axis sub-plate and the intermediate sub-plates respectively.

13. The display device according to claim 12, wherein the shaping module comprises a chain or an elastic strip; an extending direction of the chain or the elastic strip is perpendicular to the vertical axis of the central-axis sub-plate; and the chain or the elastic strip is fixedly connected to the border sub-plates, and movably connected to the borders on both sides of the central-axis sub-plate and the intermediate sub-plates respectively.

14. The display device according to claim 1, wherein the display screen is in bonded connection with the central-axis sub-plate, the intermediate sub-plates and the border sub-plates respectively.

15. The display device according to claim 14, wherein middle vertical regions of the central-axis sub-plate, the intermediate sub-plates and the border sub-plates are provided with an adhesive respectively, and the display screen is connected to the central-axis sub-plate, the intermediate sub-plates and the border sub-plates through the adhesives respectively.

16. The display device according to claim 1, further comprising a Tcon board, an SOC board, a power board and speakers, and the Tcon board, the SOC board, the power board and the speakers are arranged on the support.

17. The display device according to claim 1, wherein the support is formed by a metal material, and the support is provided with reinforcing ribs on the back.

18. The display device according to claim 1, further comprising a front frame, a back cover and a seat, wherein the front frame is arranged on borders of the front side of the display screen and is in bonded connection with the display screen; and the back cover is located behind the support, and the back cover and the seat are connected to the central-axis sub-plate.

* * * * *